United States Patent [19]

Baltrushaitis et al.

[11] 4,221,826
[45] Sep. 9, 1980

[54] COMPOSITION FOR MAKING LEADS IN INTEGRATED MICROCIRCUITS AND METHOD FOR MAKING SAME USING SAID COMPOSITION

[76] Inventors: Valentinas B. Baltrushaitis, ulitsa Vairo, 9, kv. 34; Kestutis V. Sadauskas, ulitsa Shlaito, 24, kv. 1, both of Kaunas, U.S.S.R.

[21] Appl. No.: 957,292

[22] Filed: Nov. 2, 1978

[30] Foreign Application Priority Data

Dec. 6, 1977 [SU] U.S.S.R. ............... 2550672[I]

[51] Int. Cl.$^2$ ............... B05D 5/12
[52] U.S. Cl. ............... 427/96; 252/518; 204/15; 204/52 R; 106/1.26; 106/287.16
[58] Field of Search ......... 252/518; 106/1.26, 287.16; 427/96; 204/15, 52 R

[56] References Cited

U.S. PATENT DOCUMENTS

| 2,994,614 | 8/1961 | Fitch | 106/1.26 |
| 3,163,665 | 12/1964 | Fitch | 106/1.26 X |

Primary Examiner—Benjamin R. Padgett
Assistant Examiner—J. Lloyd Barr
Attorney, Agent, or Firm—Lackenbach, Lilling & Siegel

[57] ABSTRACT

According to the invention, a composition for making leads in integrated microcircuits comprises gold bornylmercaptide of the following formula:

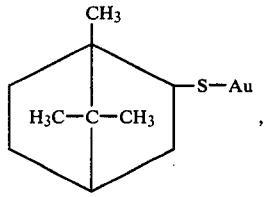

rhodium bornylmercaptide of the following formula:

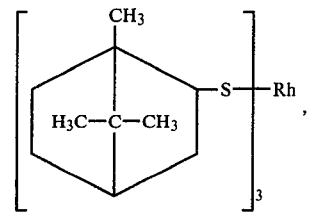

bismuth dibutyldithiocarbamate, chromium abietinate, colophony, chloroform, and cyclohexanone, the ratio of the components being as follows (% by weight):

| gold bornylmercaptide | 22.2–20.0 |
|---|---|
| rhodium bornylmercaptide | 1.0–1.1 |
| bismuth dibutyldithiocarbamate | 1.55–1.4 |
| chromium abietinate | 1.10–1.20 |
| colophony | 10.55–9.5 |
| chloroform | 31.8–33.4 |
| cyclohexanone | 31.8–33.4 |

The proposed method for making leads in integrated microcircuits, using the above composition, resides in that applied to a cleaned substrate is an adhesion film of lead-borosilicate glass 2,000 to 2,500 Å thick, said glass comprising 40% by weight of lead oxide, 10% by weight of boron oxide, and 50% by weight of silica, by baking, at 850° to 900° C. The substrate is coated with a vitrifying composition comprising tetraethoxysilane, trimethoxyboron, and lead acetate, taken in a ratio enabling a film of the above composition to be produced. The substrate coated with the adhesion film then has applied to it a current-conducting film 2,000 to 3,000 Å thick by way of thermal decomposition, at 800° to 850° C., of the proposed composition for making leads in integrated microcircuits, with subsequent electrolytic deposition on the current-conducting film of a copper layer to a required thickness, which is followed by photolithographic forming of the integrated microcircuit leads and chemical deposition thereon of a protective coating of tin or gold.

The proposed composition for making leads in integrated microcircuits permits, owing to individual chemical compounds contained therein, the obtaining of current-conducting films with stable and reproducible physicochemical properties and electrophysical parameters. Making leads in integrated microcircuits by the proposed method is simple and inexpensive.

2 Claims, No Drawings

COMPOSITION FOR MAKING LEADS IN INTEGRATED MICROCIRCUITS AND METHOD FOR MAKING SAME USING SAID COMPOSITION

FIELD OF THE INVENTION

The present invention relates to a composition for making leads in integrated microcircuits and to a method for making same using said composition. Integrated microcircuits made from said composition and by said method will find extensive application in microelectronics.

BACKGROUND OF THE INVENTION

Known in the art are various compositions for decorating glass, porcelain and ceramic products, as well as methods for applying these compositions.

One of such prior art compositions comprises the following components, % by weight:

| | |
|---|---|
| product of interaction of gold chloride with α-pinene mercaptan | 22 |
| pine oil | 21.5 |
| dipentene | 53.7 |
| flux A | 2.0 |
| flux B | 0.3 |
| flux C | 0.5. |

Flux A is essentially a solution of the following composition, % by weight:

| | |
|---|---|
| bismuth trichloride | 5 |
| ethylene chlorohydrin | 94 |
| concentrated hydrochloric acid | 1. |

Flux B represents a solution of the following composition, % by weight:

| | |
|---|---|
| rhodium trichloride | 40 |
| methanol | 60. |

Flux C is prepared as follows: charged into a 2 liter vessel are 3.4 g of pine oil, 50.9 g of cyclohexanol, 12.6 g of dill oil, 12.7 g of rosemary oil, 3.4 g of lavender oil, and 17 g of silicon tetrachloride added dropwise with stirring. The mixture is heated at 120° to 130° C. until the weight of the reaction mixture is reduced to 30 g (cf. U.S. Pat. No. 2,490,399).

Also known is a composition for metallizing various dielectric materials at a low temperature, comprising the following components (parts by weight):

| | |
|---|---|
| solution of tertiary gold dodecylmercaptide in cyclohexanone (35% by weight of gold) | 286 |
| solution of rhodium resinate in a mixture of essential oil with a hydrocarbon (1% by weight of rhodium) | 50 |
| bismuth resinate dissolved in a mixture of essential oils (4.5% by weight of bismuth) | 70 |
| chromium resinate dissolved in a mixture of cyclohexanone with turpentine oil (2.05% by weight of chromium) | 20 |
| asphalt dissolved in turpentine oil (30% by weight of asphalt) | 200 |

No data are available in the literature for compositions intended specifically for making leads in integrated microcircuits.

There are known various methods for making integrated microcircuit leads, including the widely used thick- and thin-film techniques.

In accordance with the thin-film techniques, leads in an integrated microcircuit are made by way of deposition of thin films of chromium and copper, in a fine vacuum, on a cleaned substrate of polished sitall or ceramics. To increase the thickness of the coating, one should resort to electrolytic deposition of copper, while leads are formed photolithographically (cf. Berley Louis Holme and M. Harrma, Thin-Film Technology).

The disadvantages inherent in this technique include complexity of the equipment and low output.

Also known is a method for making film resistors of an integrated microcircuit by dipping a glass or ceramic substrate cleaned in hot chromic acid into a solution of metal-organic compounds of platinum, gold and palladium. Then, the substrate is lifted at a constant speed. After the solvent has evaporated in air, the metal-organic compound decomposes at a temperature of 315° C. At the same time, the metal which is present in the compound is deposited on the substrate forming a film thereon. In order to enhance the adhesion of the film to the substrate, both are baked at 530° to 760° C. The film resistor pattern is formed photolithographically (cf. E. E. Wright and W. W. Weich, Electrochemical Technology, 2, 262,1964). Films of noble metals, obtained in this fashion, are 1,000 to 3,000 Å thick and have a surface resistivity of 100-0.3 ohms/kV, which renders them unsuitable for leads in integrated microwave microcircuits where they must be 5 to 15 microns thick and have a surface resistivity not exceeding 0.003 ohms/kV. Besides, the adhesion of current-conducting films to sitall and ceramic substrates is inadequate.

SUMMARY OF THE INVENTION

It is an object of the present invention to provide a composition for making leads in integrated microcircuits, which will be stable in storage, with the current-conducting films made from such a composition exhibiting high adhesion to sitall and ceramic substrates.

Another object of the invention is to provide a method for making leads in integrated microcircuits, using said composition, which will ensure high quality of the leads and high precision in their making, while being inherently simple.

These objects are attained by a composition for making leads in integrated microcircuits, comprising gold bornylmercaptide of the following formula:

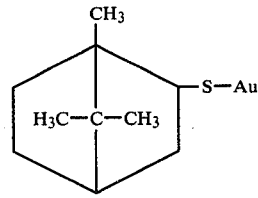

rhodium bornylmercaptide of the following formula:

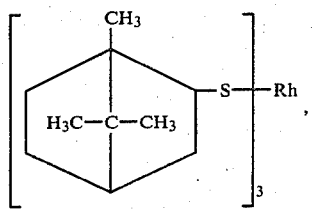

bismuth dibutyldithiocarbamate, chromium abietinate, colophony, chlorophorm, and cyclohexanone, the ratio of the components being as follows (% by weight):

| | |
|---|---|
| gold bornylmercaptide | 22.2–20.0 |
| rhodium bornylmercaptide | 1.0–1.1 |
| bismuth dibutyldithiocarbamate | 1.55–1.4 |
| chromium abietinate | 1.10–1.20 |
| colophony | 10.55–9.5 |
| chloroform | 31.8–33.4 |
| cyclohexanone | 31.8–33.4 |

According to the invention, a method for making leads in integrated microcircuits resides in applying to a cleaned substrate an adhesion film of lead-borosilicate glass 2,000 to 2,500 Å thick, said glass comprising 40% by weight of lead oxide, 10% by weight of boron oxide, and 50% by weight of silica, by baking, at 850° to 900° C., the substrate coated with a vitrifying composition comprising tetraethoxysilane, trimethoxyboron, and lead acetate, taken in a ratio enabling a film of the above composition to be produced, whereafter applied to the substrate coated with the adhesion film is a current-conducting film 2,000 to 3,000 Å thick by way of thermal decomposition, at 800° to 850° C., of a composition with the following ratio of components, % by weight:

| | |
|---|---|
| gold bornylmercaptide | 22.2–20.0 |
| rhodium dornylmercaptide | 1.0–1.1 |
| bismuth dibutyldithiocarbamate | 1.55–1.4 |
| chromium abietinate | 1.10–1.20 |
| colophony | 10.55–9.5 |
| chloroform | 31.8–33.4 |
| cyclohexanone | 31.8–33.4, | with subsequent electrolytic deposition on the current-conducting film of a copper layer to a required thickness, which is followed by photolithographic forming of the integrated microcircuit leads and chemical deposition thereon of a protective coating of tin or gold.

DETAILED DESCRIPTION OF THE INVENTION

The present invention is realized as follows.

Gold and rhodium bornylmercaptides are prepared in advance and, separately, a solvent (a solution of colophony in a mixture of chloroform with cyclohexanone).

Used as the basis for obtaining gold and rhodium bornylmercaptides is 1,7,7-trimethylbicyclo(2,2,1)-heptane-2-thiole which reacts with rhodium or gold chloride as follows:

2(CH$_3$)$_2$S + AuCl$_3$ + H$_2$O ⟶
(CH$_3$)$_2$S . AuCl + (CH$_3$)$_2$S = O + 2HCl.

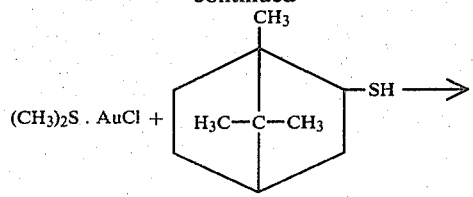

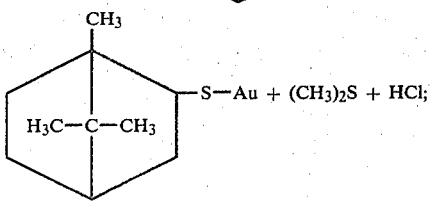

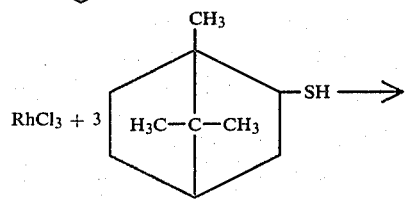

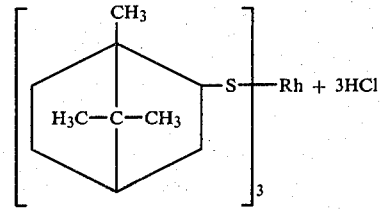

Gold bornylmercaptide is a white amorphous powder insoluble in water, alcohol and acetone, but readily soluble in aromatic hydrocarbons, nitrobenzene, chloroform and essential oils, the gold content in this compound being 53.8% by weight.

Gold bornylmercaptide decomposes within the following temperature range:
beginning of decomposition—134° C.,
end of decomposition—240° C.

Calculated, % by weight: Au—53.8; C—32.8; H—4.65; S—8.74. Found, % by weight: Au—53.46; C—32.68; H—4.83; S—8.65.

Rhodium bornylmercaptide is a brown amorphous powder insoluble in water, alcohol and alkali, but readily soluble in aromatic hydrocarbons, nitrobenzene, chloroform and essential oils, the rhodium content in this compound being 16.8% by weight.

Rhodium bornylmercaptide decomposes within the following temperature range:
beginning of decomposition—150° C.,
end of decomposition—292° C.

Calculated, % by weight: C—59.2; H—8.36; S—15.74; Rh—16.88. Found, % by weight: C—59.21; H—8.12; S—15.2; Rh—16.97.

The solvent is prepared separately by dissolving 100 g of colophony in a mixture of 300 ml of chloroform and 300 ml of cyclohexanone.

Gold and rhodium bornylmercaptides, bismuth dibutyldithiocarbamate, chromium abietinate and the separately prepared solvent are mixed in a vessel in the following ratio, % by weight:

| | |
|---|---|
| gold bornylmercaptide | 22.2–20.0 |
| rhodium bornylmercaptide | 1.0–1.1 |

-continued

| bismuth dibutyldithiocarbamate | 1.55–1.4 |
| chromium abietinate | 1.10–1.20 |
| colophony | 10.55–9.5 |
| chloroform | 31.8–33.4 |
| cyclohexanone | 31.8–33.4 |

The resulting red solution is filtered and decanted into a vessel with a ground-glass stopper.

The proposed composition is used in the process of making leads of integrated microcircuits.

The process under consideration resides in the following.

Sitall, ceramic or quartz substances are cleaned in a conventional manner, e.g. with a hot solution of chromic acid, till the surface becomes completely wettable with water. A cleaned substrate is placed in a centrifuge, the rotor speed is set to 3,000 rpm, and a pipette is used to apply a vitrifying composition comprising tetraethoxysilane, trimethoxyboron and lead acetate in a ratio providing for a film of lead-borosilicate glass comprising 40% by weight of lead oxide, 50% by weight of silica, and 10% by weight of boron oxide. After the vitrifying composition has been applied, the substrate is rotated for 1 minute, then baked in a conveyor-type oven at 850° to 900° C. with the result that a continuous film of lead-borosilicate glass 2,000 to 2,500 Å is formed on the substrate surface. The film provides for adequate adhesion of the current-conducting coating to the substrate. Then, the substrate with the adhesion film is placed in the centrifuge, and the proposed composition for making integrated microcircuit leads is pipetted thereon. The centrifuge speed is 2,400 to 3,000 rpm. To remove the solvent, the rotation takes 1 minute. Thereafter, baking in the conveyor oven at 800° to 850° C. takes place. As a result, a mirror-like solid current-conducting film of gold is produced, 2,000 to 3,000 Å thick. The chromium and bismuth oxides formed as a consequence of baking and forming part of the current-conducting film chemically interact with the vitrifying composition and enhance the adhesion of the current-conducting film, increasing it to 200–300 kg/sq.cm.

After baking, the composition of the current-conducting film is as follows, % by weight:

| Au | 94.5 |
| Rh | 1.3 |
| $Cr_2O_3$ | 0.7 |
| $Bi_2O_3$ | 3.5 |

To increase the thickness and electric conductivity of the current-conducting film, copper is electrolytically deposited thereon.

The copper electrolyte has the following composition:

| copper sulfate | 200 g/l |
| sulfuric acid (d = 1.84) | 50 g/l |
| sodium chloride | 0.06 g/l |
| brightener | 5 ml/l |

At room temperature, the rate of copper deposition of the electrolyte at a cathode current density of 4 A/sq.dm is 25 microns per hour.

The use of a brightener ensures a mirror-like coat, which is required for quality photolithography.

The adhesion of the coating is at least 100 kg/sq.cm.

Leads of the required configuration are formed photolithographically. Thereafter, a protective tin or gold coating is chemically applied on the leads.

The proposed composition makes it possible, owing to the individual chemical compounds contained therein, to obtain current-conducting films with stable and reproducible physicochemical properties and electrophysical parameters. Besides, the composition is stable in long-term storage, while the current-conducting films exhibit strong adhesion to the substrate, as high as 200 to 300 kg/sq.cm, and their microstructure is perfect.

Making leads in integrated microcircuits by the proposed method does not require any specialized and expensive equipment or highly skilled personnel, and the quality of leads thus produced is not inferior to that of leads produced using thin-film techniques. The only limitations of this method are imposed by photolithography, and the adhesion of the obtained coatings is superior to that of films produced by vacuum techniques.

The current-conducting film is formed in a conveyor-type oven, which provides for high efficiency of the method and permits its application at facilities where equipment for making thick-film microcircuits is available.

For a better understanding of the invention, the following examples of its practical embodiment are given by way of illustration.

EXAMPLE 1

A 250 ml beaker is charged with a mixture of 8 g of dimethyl sulfide, 10 g of 1,7,7-trimethylbicyclo(2,2,1)-heptane-2-thiole and 50 ml of chloroform. While the mixture is being stirred for 45 minutes, a solution of 15 g of gold chloride in 100 ml of water is poured thereinto, and the resulting mixture is stirred for another hour at room temperature. Then, the water layer is decanted, and the amber chloroform solution is washed with three portions of water 300 ml each, the water being decanted after each washing. The solution is transferred into a dropping funnel and is added dropwise, with vigorous stirring, to 1 l of methanol. The resulting precipitate is filtered with the aid of a Büchner funnel, washed with methanol and dried at a temperature of 50° C.

Obtained: 17.3 g of a white amorphous powder of gold bornylmercaptide (yield: 96% of the theoretical).

Decomposition temperature: beginning—174° C., end—240° C.

Calculated, % by weight: C—32.8, H—4.65, S—8.74, Au—53.8.

Found, % by weight: C—32.68, H—4.83, S—8.65, Au—53.46.

Dissolved in a 250 ml beaker are 10.6 g of rhodium trichloride in 100 ml of ethyl alcohol, and 100 g of 1,7,7-trimethylbicyclo(2,1,1)-heptane-2-thiole are added with stirring. The reaction mixture is heated to boiling for 2 to 2.5 hours, the mixture volume being maintained constant by adding ethyl alcohol. The reaction being over, the beaker is cooled down to 0° C. and the top liquid layer is decanted, while the dark brown resin is washed with ethyl alcohol portions of 50 ml each until the resin becomes solid, the colored top layer of liquid being decanted after each washing. The solidified resin is dissolved in 50 ml of chloroform, and the resulting solution is poured, with vigorous stirring, into 1,000 ml of methanol. The precipitate is filtered by means of a Büchner funnel, washed with methanol and dried at 40° to 45° C.

Obtained: 45.7 g of a brown amorphous powder (yield: 75% of the theoretical). Rhodium bornylmercaptide is insoluble in water, alcohol and acetone, but readily soluble in nitrobenzene, chloroform, methylene chloride, cyclohexanone and essential oils.

Decomposition temperature: beginning 150° C., end 292° C.

Calculated, % by weight: C—59.2, H—8.36, S—15.74, Rh—16.88.

Found, % by weight: C—59.21, H—8.12, S—15.2, Rh—16.98.

The solvent is prepared by dissolving 100 g of colophony in a mixture of 300 ml of chloroform and 300 ml of cyclohexanone.

To prepare the composition for making leads in an integrated microcircuit, gold and rhodium bornylmercaptides, bismuth dibutyldithiocarbamate, chromium abietinate and the solvent are mixed in a vessel, the ratio of the components being as follows, % by weight:

| | |
|---|---|
| gold bornylmercaptide | 20.0 |
| rhodium bornylmercaptide | 1.1 |
| bismuth dibutyldithiocarbamate | 1.4 |
| chromium abietinate | 1.2 |
| colophony | 9.5 |
| chloroform | 33.4 |
| cyclohexanone | 33.4 |

The obtained composition can be stored indefinitely.

To make leads in integrated microcircuits, a sitall substrate is cleaned with a hot solution of chromic acid until the surface becomes completely wettable with water. The cleaned substrate is placed in a centrifuge, the rotor speed is set to 3,000 rpm and a pipette is used to apply a vitrifying composition comprising tetraethoxysilane, trimethoxyboron and lead acetate in a ratio sufficient to obtain a film of lead-borosilicate glass containing 40% by weight of lead oxide, 50% by weight of silica, and 10% by weight of boron oxide.

After the vitrifying composition has been applied, the substrate is rotated for 1 min, then baked in a conveyor oven at 875° C. Formed on the substrate surface is a lead-borosilicate film 2,250 Å thick. Thereafter, the substrate with the deposited adhesion film is placed in the centrifuge and 0.2 ml of the above composition for making leads in integrated microcircuits are pipetted thereon; the centrifuge speed is 2,700 rpm. The substrate is rotated for 1 min and baked (to provide for thermal decomposition of said composition) in the conveyor oven at 825° C. As a result, a current-conducting film 2,500 Å is obtained. Then, copper is electrolytically deposited on the current-conducting film. The coppering electrolyte has the following composition:

| | |
|---|---|
| copper sulfate | 200 g/l |
| sulfuric acid (d = 1.84) | 50 g/l |
| sodium chloride | 0.06 g/l |
| brightener | 5 ml/l |

For the electrolyte at room temperature, the rate of copper deposition at a cathode density of 4 A/sq.dm is 25 microns per hour. Leads of an appropriate shape are formed photolithographically. Thereafter, a protective tin coating is chemically applied on the leads.

The surface resistivity of the leads which are 15 microns this is 0.0013 ohms/kV, the adhesion being at least 100 kg/sq.cm.

EXAMPLE 2

The composition and its application are similar to those described in Example 1, except that the components of the composition are mixed in the following ratio, % by weight:

| | |
|---|---|
| gold bornylmercaptide | 22.2 |
| rhodium bornylmercaptide | 1.0 |
| bismuth dibutyldithiocarbamate | 1.55 |
| chromium abietinate | 1.10 |
| colophony | 10.55 |
| chloroform | 31.8 |
| cyclohexanone | 31.8 |

The method of making leads in integrated microcircuits and properties thereof are similar to those described in Example 1.

What is claimed is:

1. A composition for making leads in integrated microcircuits, comprising gold bornylmercaptide of the following formula:

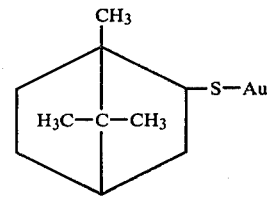

rhodium bornylmercaptide of the following formula:

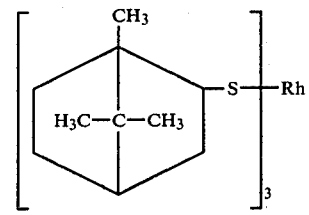

bismuth dibutyldithiocarbamate, chromium abietinate, colophony, chloroform and cyclohexanone, the ratio of the components being as follows, % by weight:

| | |
|---|---|
| gold bornylmercaptide | 22.2–20.0 |
| rhodium bornylmercaptide | 1.0–1.1 |
| bismuth dibutyldithiocarbamate | 1.55–1.4 |
| chromium abietinate | 1.10–1.20 |
| colophony | 10.55–9.5 |
| chloroform | 31.8–33.4 |
| cyclohexanone | 31.8–33.4. |

2. A method for making leads in integrated microcircuits, residing in that applied to a cleaned substrate is an adhesion film of lead-borosilicate glass 2,000 to 2,500 Å thick, said glass comprising 40% by weight of lead oxide, 10% by weight of boron oxide, and 50% by weight of silica, by baking, at 850° to 900° C., the substrate coated with a vitrifying composition comprising tetraethoxysilane, trimethoxyboron, and lead acetate, taken in a ratio enabling a film of the above composition to be produced, whereafter applied to the substrate coated with the adhesion film is a current-conducting film 2,000 to 3,000 Å by way of thermal decomposition, at 800° to 850° C., of a composition with the following ratio of components, % by weight:

gold bornylmercaptide of the following formula:

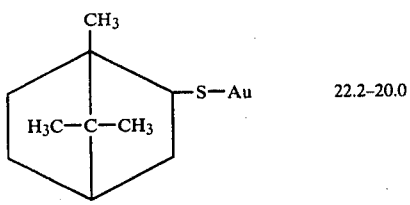 22.2–20.0 rhodium bornylmercaptide of the following formula:

| | |
|---|---|
| [structure with Rh]₃ | 1.0–1.1 |
| bismuth dibutyldithiocarbamate | 1.55–1.4 |
| chromium abietinate | 1.10–1.20 |
| colophony | 10.55–9.5 |
| chloroform | 31.8–33.4 |
| cyclohexanone | 31.8–33.4, | with subsequent electrolytic deposition on the current-conducting film of a copper layer to a required thickness, which is followed by photolithographic forming of the integrated microcircuit leads and chemical deposition thereon of a protective coating of tin or gold.

* * * * *